US006979852B2

(12) United States Patent
Poveda

(10) Patent No.: US 6,979,852 B2
(45) Date of Patent: Dec. 27, 2005

(54) VARIABLE CAPACITANCE

(75) Inventor: Patrick Poveda, Villedomer (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/669,107

(22) Filed: Sep. 23, 2003

(65) Prior Publication Data

US 2004/0056328 A1 Mar. 25, 2004

(30) Foreign Application Priority Data

Sep. 25, 2002 (FR) .............................. 02 11848

(51) Int. Cl.⁷ ................... H01L 27/108; H01L 29/76
(52) U.S. Cl. .................. 257/301; 302/308; 302/309
(58) Field of Search ............................ 257/301, 302, 257/308, 309

(56) References Cited

U.S. PATENT DOCUMENTS 4,017,885 A * 4/1977 Kendall et al. ............. 257/534

FOREIGN PATENT DOCUMENTS

FR  2 389 237 A1  11/1978

OTHER PUBLICATIONS

French Search Report from French Patent Applicatioin No. 02/11848, filed Sep. 25, 2002.

* cited by examiner

*Primary Examiner*—Amir Zarabian
*Assistant Examiner*—Kiesha Rose
(74) *Attorney, Agent, or Firm*—Lisa K. Jorgenson; James H. Morris; Wolf, Greenfield & Sacks, P.C.

(57) ABSTRACT

A variable capacitance formed in a semiconductor substrate with a ribbed surface, having a first electrode formed of all the ribs protruding from the substrate, of portions of the substrate underlying the ribs, and of at least portions of the substrate separating the bases of two ribs, having a second electrode superposed to at least one portion of the first electrode. The ribs are irregular in terms of cross-section and/or planar base surface area.

12 Claims, 2 Drawing Sheets

VARIABLE CAPACITANCE

BACKGROUND OF THE INVENTION

1. Field of the Invention

The present invention relates to variable capacitance components formed in a semiconductor substrate.

2. Discussion of the Related Art

A component having a capacitance varying in accordance with a voltage reference is used, for example, in a voltage-controlled oscillator (VCO).

FIG. 1 partially and schematically illustrates a perspective view of a first electrode of a variable capacitance formed in a lightly-doped N-type silicon substrate 1. Substrate 1 comprises a series of identical regularly spaced ribs 2 each having a rectangular planar base.

FIG. 2 illustrates, in a partial simplified lateral cross-section view, a Schottky diode using the first electrode of FIG. 1. The silicon surface of the first electrode may be completed by a heavily-doped N-type surface region 3. Region 3 is continuous and extends in the upper planar surface of ribs 2, along their vertical walls and in the planar surfaces of substrate 1 separating the bases of neighboring ribs. A layer 4 of a conductive material capable of forming a Schottky barrier, such as a metal silicide, covers the entire structure. The Schottky diode thus comprises a first electrode (cathode) formed by substrate 1 comprising ribs 2 and a second electrode (anode) formed by silicide 4. The diode is generally completed by metallizations (not shown) contacting, at their rear surface, substrate 1 and, at their front surface, silicide 4.

In a reverse biasing (positive voltage applied on the cathode), the diode of FIG. 2 behaves as a capacitor, the inter-electrode insulator of which is the space charge area (or depleted area) which extends in region 3, if present, and substrate 1.

FIG. 3 is a graph partially and schematically illustrating variation C(V) of capacitance C of the diode of FIG. 2 versus value V of the reverse voltage. Capacitance C drops when value V increases. From a given limiting value or pinch-off voltage Vp, capacitance C abruptly varies towards a low value Vth. Pinch-off voltage Vp is the value for which the extension of the depleted area in substrate 1 is such that the volume of ribs 2 is completely depleted by the carriers. Value Vth corresponds to the limiting value of extension of the depleted area into substrate 1.

A disadvantage of a variable capacitance such as previously described is the discontinuity in the capacitance variation around pinch-off voltage Vp. Due to this discontinuity, the capacitance (frequency) range corresponding to a reverse biasing beyond pinch-off voltage Vp has to be, in practice, excluded from the operation, which does not enable sweeping a wide frequency range in an application to a VCO.

For a VCO to operate over a wide frequency range, several distinct devices must thus be used to enable frequency tunings on different frequency ranges. This goes against the desire to reduce the size of devices.

The problems previously discussed for a Schottky diode also arise if a reverse-biased PN junction is used as a variable capacitance. As compared to the structure of the Schottky diode of FIG. 2, a very heavily-doped P-type surface region is formed in heavily-doped N-type region 3. The presence of the P-type region further increases the complexity of the setting of the doping of N-type region 3, if present. It should be reminded that region 3 is optional; the heavily-doped P-type region may thus replace it.

The previously-discussed problems generally arise in any variable capacitance.

SUMMARY OF THE INVENTION

The present invention aims at providing a variable capacitance having a uniform variation according to voltage, with no abrupt variation.

The present invention aims at providing such a capacitance which enables sweeping an extended capacitance range.

To achieve these and other objects, the present invention provides a variable capacitance formed in a semiconductor substrate with a ribbed surface, having a first electrode formed of all the ribs protruding from the substrate, of portions of the substrate underlying the ribs, and of at least portions of the substrate separating the bases of two ribs, having a second electrode superposed to at least one portion of the first electrode. The ribs are irregular in terms of cross-section and/or planar base surface area.

According to an embodiment of the present invention, two successive ribs exhibit non-parallelepiped shaped trapezoidal bases of same surface areas.

According to an embodiment of the present invention, two successive ribs are arranged in quincunx.

According to an embodiment of the present invention, two successive ribs exhibit trapezoidal bases of different surface areas.

According to an embodiment of the present invention, the rib bases are rectangular.

The foregoing objects, features and advantages of the present invention will be discussed in detail in the following non-limiting description of specific embodiments in connection with the accompanying drawings.

DETAILED DESCRIPTION

Figure 1:
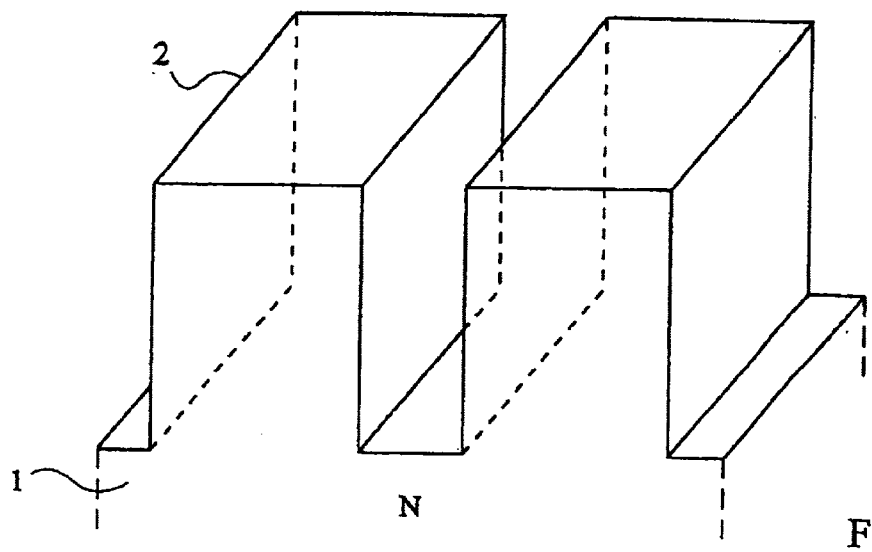
FIG. 1 is a partial simplified perspective view of a conventional electrode of a variable capacitance.

For clarity, the same elements have been referred to with the same reference numerals in the different drawings and, further, the drawings are not to scale.

A feature of the present invention is to replace an electrode comprising ribs of regular geometry with an electrode comprising ribs of irregular geometry regarding their cross-section, or their surface area, or both.

Figure 4:
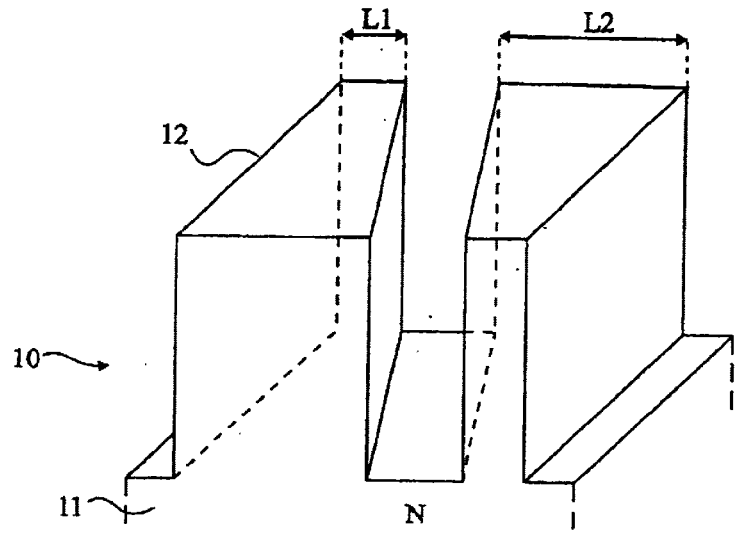
FIG. 4 illustrates, in a partial simplified perspective view, an embodiment of an electrode of a variable capacitance according to the present invention.

FIG. 4 illustrates in a partial simplified perspective view an embodiment of an electrode 10 of a variable capacitance according to the present invention.

Electrode 10 is formed in a semiconductor substrate 11, for example, silicon, lightly doped of a first conductivity type, for example N. It should be noted that substrate is used to designate as well a uniformly-doped single-crystal silicon wafer as epitaxial regions and/or regions specifically doped by diffusion/implantation formed on or in a solid substrate. Electrode 10 is more specifically formed of a set of ribs 12 which exhibit a trapezoidal base having its two parallel sides of different lengths, L1 and L2. Ribs 12 are thus irregular in terms of cross-section.

According to an embodiment of the present invention, when ribs 12 are irregular in terms of cross-section, they are, as illustrated in FIG. 4, regular in terms of surface area, that is, all identical.

Preferably, as illustrated in FIG. 4, ribs 12 are arranged in quincunx in substrate 11. Thus, the surface area taken up by two neighboring ribs 12 is reduced as compared to the surface area that they would take up if their coplanar parallel sides exhibited the same length L1 or L2.

Such an electrode 10 is then usable to form a variable capacitance. Thus, in a Schottky diode, electrode 10 can be completed by a doped surface region of the same conductivity type as substrate 11, but more heavily doped. The Schottky diode is completed by an anode formed by a conformally superposed layer capable of forming a Schottky barrier.

Figure 5:
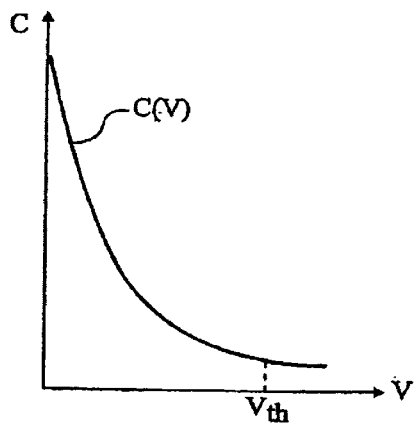
FIG. 5 is a graph illustrating the capacitance variation versus the voltage applied across a capacitor comprising an electrode having the structure of FIG. 4.

FIG. 5 is a graph which partially and schematically illustrates variation C(V) of capacitance C of such a Schottky diode according to the reverse voltage V applied thereacross.

Figure 3:
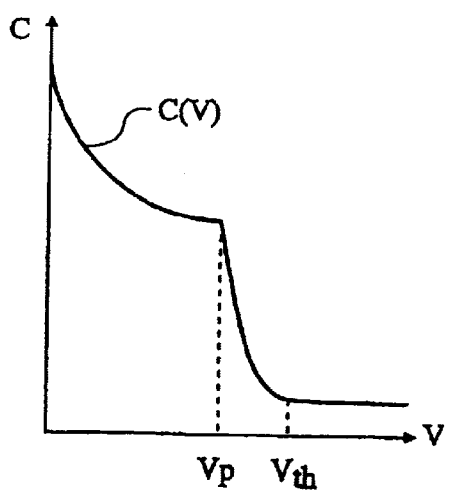
FIG. 3 is a graph illustrating the variation of the capacitance versus the reverse bias voltage of the diode of FIG. 2.

As compared to homologous curve C(V) of FIG. 3 comprising a conventional electrode illustrated in FIG. 1, variation C(V) obtained with an electrode 10 according to the present invention is more uniform. This improved uniformity especially translates as a suppression of the capacitance discontinuity around a pinch-off voltage. This improved uniformity is allowed by the fact that ribs 12 are progressively depleted for successive voltages and not abruptly around a threshold.

Figure 2:
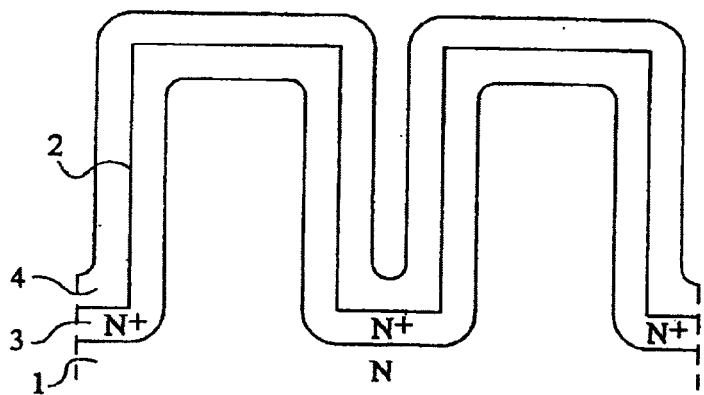
FIG. 2 illustrates in a partial simplified transversal cross-section view of a Schottky diode using the first electrode of FIG. 1.

The possible variation range of the voltage reference of a VCO is then extended with respect to the case described in relation with FIGS. 1 and 2. It is thus possible to securely sweep a wider frequency range. The present inventor's studies have enabled showing that, for a small voltage range, for example, between 0 and 3V, the minimum capacitance is on the order of from one tenth to one twentieth of the maximum capacitance. Further, this ratio directly depends on the rib dimensions.

Figure 6:
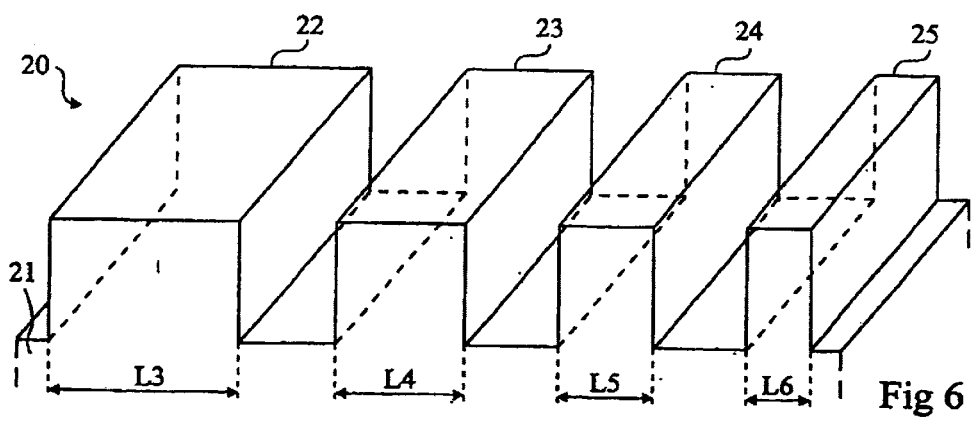
FIG. 6 illustrates, in a partial simplified perspective view, another embodiment of an electrode of a variable capacitance according to the present invention.

FIG. 6 illustrates, in a partial simplified perspective view, another embodiment of an electrode 20 of a variable capacitance according to the present invention.

Electrode 20, formed in a substrate 21, comprises ribs 22, 23, 24, and 25 having parallelepiped-shaped trapezoidal bases, for example, rectangular, but of irregular widths L3, L4, L5, and L6. Ribs 22, 23, 24, and 25 are thus regular in cross-section and irregular in surface area.

Figure 7:
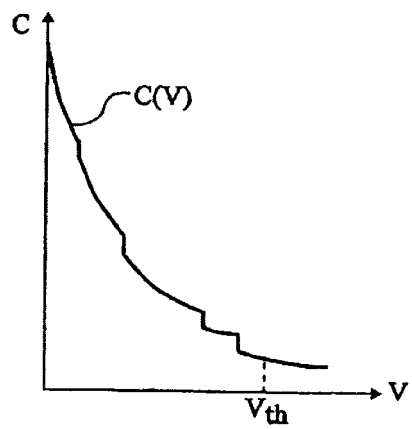
FIG. 7 is a graph illustrating the capacitance variation versus the voltage applied across a capacitance comprising an electrode having the structure of FIG. 6.

Then, as schematically and partially illustrated by the graph of FIG. 7, a curve of the capacitance variation according to voltage V which is uniform by steps is obtained for a variable capacitance comprising electrode 20 of FIG. 6. Each step corresponds to the pinching, at the total depletion, of ribs 22, 23, 24, and 25 having a given width L3, L4, L5, and L6. The variation at the end of each step is limited by the neighboring presence of non-depleted ribs.

According to an embodiment not shown, an electrode of a variable capacitance may comprise ribs simultaneously irregular in cross-section and in surface area. As it is irregular in cross-section, each rib has a trapezoidal base such that its parallel supports have different lengths. As they are irregular in surface area, the bases of different ribs exhibit different surface areas.

The present invention is likely to have various alterations, modifications, and improvements which will readily occur to those skilled in the art. In particular, specific shapes and arrangements of the ribs have been considered in the description of the present invention. However, those skilled in the art will know that the shape of the trapezoidal ribs and their number may be adjusted according to constraints linked to the specific manufacturing process.

Further, a variable capacitance formed as a reverse-biased Schottky diode has been considered in the foregoing description of the present invention. However, the present invention also applies to any other forming of a variable capacitance in which the insulating area is formed by a space charge area. Thus, the variable capacitance may be formed as a reverse-biased PN junction. Similarly, the capacitance may be formed by the stacking of any one of the previously-described trapezoidal base electrodes, of a MOS-type insulator (oxide), and of a second conductive electrode.

The variable capacitance may be formed of the association of several variable capacitances. For example, capacitances are formed on the planar upper trapezoidal surfaces of the ribs of the first electrode from a junction, either of Schottky type, or of PN type, and MOS-type capacitances are formed on the lateral walls of the ribs and between two ribs.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A variable capacitor formed in a semiconductor substrate with a ribbed surface having a plurality of ribs, the capacitor having a first electrode formed of all the ribs protruding from the substrate, of portions of the substrate underlying the ribs, and of at least portions of the substrate separating the bases of two of the ribs, and having a second electrode superposed to at least one portion of the first electrode, wherein the ribs are either;

non-identical in terms of planar base surface area; or
    identical in terms of planar base surface area and non-identical in terms of cross-section.

2. The capacitor of claim 1, wherein the ribs are identical in terms of planar base surface area and non-identical in terms of cross-section, and wherein two successive ribs exhibit non-parallelepiped shaped trapezoidal bases of same surface areas.

3. The capacitor of claim 2, wherein two successive ribs are arranged in quincunx.

4. The capacitor of claim 1, wherein the ribs are non-identical in terms of planar base surface area, and wherein two successive ribs exhibit non-rectangulared shaped trapezoidal bases of different surface areas.

5. The capacitor of claim 1, wherein the ribs are non-identical in terms of planar base surface area.

6. The capacitor of claim 1, wherein the ribs are identical in terms of planar base surface area and non-identical in terms of cross-section.

7. The capacitor of claim 6, wherein the capacitor comprises a variable capacitance that varies uniformly according to voltage.

8. The capacitor of claim 5, wherein the capacitor comprises a variable capacitance that varies uniformly according to voltage.

9. The capacitor of claim 6, wherein the variable capacitor comprises a lightly-doped N-type substrate superposed by a heavily-doped N-type surface; and wherein the lightly-doped N-type substrate and the heavily-doped N-type surface are further superposed by a conductive material.

10. The capacitor of claim 5, wherein the variable capacitor comprises a lightly-doped N-type substrate superposed by a heavily-doped N-type surface; and wherein the lightly-doped N-type substrate and the heavily-doped N-type surface are further superposed by a conductive material.

11. The capacitor of claim 6, wherein the variable capacitor comprises a reversed-biased PN junction Schottky diode comprising a heavily-doped P-type surface formed in a heavily-doped N-type region.

12. The capacitor of claim 5, wherein the variable capacitor comprises a reversed-biased PN junction Schottky diode comprising a heavily-doped P-type surface formed in a heavily-doped N-type region.

* * * * *